United States Patent
Pail et al.

(10) Patent No.: US 7,075,331 B2
(45) Date of Patent: Jul. 11, 2006

(54) METHODS AND SYSTEMS FOR PROVIDING HARDWARE ASSISTED PROGRAMMING OF A PROGRAMMABLE LOGIC DEVICE IN AN EMBEDDED SYSTEM

(75) Inventors: Michael R. Pail, Cary, NC (US); Jeremy T. Baus, Raleigh, NC (US); Robert Wallace, Apex, NC (US)

(73) Assignee: Tekelec, Calabasas, CA (US)

( * ) Notice: Subject to any disclaimer, the term of this patent is extended or adjusted under 35 U.S.C. 154(b) by 0 days.

(21) Appl. No.: 10/860,189

(22) Filed: Jun. 3, 2004

(65) Prior Publication Data

US 2006/0017461 A1    Jan. 26, 2006

(51) Int. Cl.
G06F 7/38      (2006.01)
H03K 19/173    (2006.01)
H03K 19/177    (2006.01)

(52) U.S. Cl. .............................. 326/38; 326/39; 716/16
(58) Field of Classification Search ............ 326/38–39; 716/16
See application file for complete search history.

(56) References Cited

U.S. PATENT DOCUMENTS

| | | | | |
|---|---|---|---|---|
| 5,987,542 | A * | 11/1999 | Bang ............................ | 710/65 |
| 6,636,936 | B1 * | 10/2003 | Terrill et al. ................. | 711/103 |
| 6,744,274 | B1 * | 6/2004 | Arnold et al. ................ | 326/16 |
| 6,828,823 | B1 * | 12/2004 | Tsui et al. .................... | 326/40 |

FOREIGN PATENT DOCUMENTS

EP    0 196 771 B1    5/1993

OTHER PUBLICATIONS

Dunlap et al., "Configuring Xilinx FPGAs Using an SC9500 CPLD and Parallel PROM", Xilinx, Inc., Version 1.1, (Jul. 27, 2000).
Carl Carmichael, "Configuring Virtex FPGAs from Parallel EPROMs with a CPLD", XAPP 137, Version 1.0 (Mar. 1, 1999).
"Virtex FPGA Series Configuration and Readback", XAPP 138, Version 2.7 (Jul. 11, 2002).
"Virtex ™ 2.5 V Field Programmable Gate Arrays", DS003-2, Version 2.8.1, (Dec. 9, 2002).
Randal Kuramoto "J Drive: In-System Programming of IEEE Standard 1532 Devices", Xilink, Inc., XAPP500, Version 1.1 (Jan. 17, 2001).

(Continued)

*Primary Examiner*—Rexford Barnie
*Assistant Examiner*—Jason Crawford
(74) *Attorney, Agent, or Firm*—Jenkins, Wilson, Taylor & Hunt, P.A.

(57) ABSTRACT

A programmable logic device (PLD) in a microprocessor system is programmed with minimal load on system resources. A microprocessor reads programming data from a first memory using a parallel bussed interface and writes the programming data to a programming hardware assist engine using the parallel bussed interface. The programming hardware assist engine directs a portion of the programming data to a specified serial interface signal, and outputs a serial bit stream from the programming hardware assist engine to a serial programming interface of the PLD using the specified serial interface signal.

21 Claims, 9 Drawing Sheets

OTHER PUBLICATIONS

"Xilinx In-System Programming Using an Embedded Microcontroller", Xilinx, Inc., XAPP058, Version 3 (Jan. 15, 2001).

"Configuration and Readback of Virtex FPGAs Using (JTAG) Boundary Scan", Xilinx, Inc., XAPP139, Version 1.6 (Sep. 12, 2003).

* cited by examiner

METHODS AND SYSTEMS FOR PROVIDING HARDWARE ASSISTED PROGRAMMING OF A PROGRAMMABLE LOGIC DEVICE IN AN EMBEDDED SYSTEM

TECHNICAL FIELD

The present invention relates generally to methods and systems for programming logic devices in embedded microprocessor systems. More particularly, the present invention relates to methods and systems for providing hardware assisted programming of a programmable logic device in an embedded microprocessor system.

BACKGROUND ART

Programmable logic devices (PLDs), such as field programmable gate arrays, are frequently used in microprocessor-based systems. The advantages of PLDs include design flexibility and improved time-to-market for products, since large groups of discrete logic components and the connections between them can be replaced by a single integrated circuit. Hardware platforms can be finalized early in the design process and product enhancements may be implemented by changing the programming of the PLD.

A trade-off, however, is that field programmable logic devices may be implemented using volatile interconnections, including RAM-based architectures. As such, the PLD may need to be reprogrammed after a system restart or power-up, typically during a system initialization procedure. In many hardware systems, it is desirable to ensure that the system is configured and operational as quickly as possible. This is especially true in telecommunications systems where the time to restart a failing system equates to the time a service is unavailable. Moreover, regulations or industry standards may establish a maximum restart time that must be met.

In embedded systems, the microprocessor often bears the burden of programming all programmable logic devices in addition to initializing other hardware and software as part of a system initialization routine.

In general, PLDs may be programmed by transferring a bit stream of programming data using either a serial or parallel mode. The PLD decodes the bit stream and configures its internal logic accordingly. In the serial mode, data and clock signals may be produced by the microprocessor to provide programming data to the PLD. This technique, known as "bit-banging," may be implemented using a general purpose I/O port of the microprocessor and requires the microprocessor to toggle the value of a bit in the associated port register to produce the clock signal, which may prevent the microprocessor from performing other tasks. In parallel mode, the PLD may be programmed by writing data to the PLD using the microprocessor's address and data bus. Although more efficient than serial programming, I/O pins used by the PLD to connect to the address and data bus remain connected to the bus after programming, which may not be desirable in some architectures. In addition, direct access to address and data busses may not be possible in some architectures.

Accordingly, there is a need in the art to provide a method and system for programming PLDs in an embedded microprocessor system that efficiently uses microprocessor resources.

DISCLOSURE OF THE INVENTION

In accordance with one aspect of the invention, a programming hardware assist engine includes a data register, a control register, and a serial interface process. The data register receives programming data and control information to be written to a programmable logic device (PLD). The control register stores bits to control the writing of the programming data and the control information to the PLD. The serial interface process reads the bits in the control register and controls the writing of the data from the data register to the PLD.

In accordance with another aspect of the invention, there is a method of programming a programmable logic device (PLD) in a microprocessor system. A microprocessor reads programming data from a first memory using a parallel bussed interface and writes the programming data to a programming hardware assist engine using the parallel bussed interface. The programming hardware assist engine directs a portion of the programming data to a specified serial interface signal, and outputs a serial bit stream from the programming hardware assist engine to a serial programming interface of the PLD using the specified serial interface signal.

In accordance with yet another aspect of the invention, there is an embedded microprocessor system comprising a microprocessor and non-volatile memory operatively coupled to an address bus and data bus. The non-volatile memory has addressable memory locations and a portion of the locations contain instructions executable by the microprocessor and another portion of the locations contain data. The system includes a programmable logic device having a serial programming interface and a programming hardware assist engine having a parallel interface, a serial interface, and control circuitry. The parallel interface of the programming hardware assist engine is operatively coupled to the address bus and data bus and the serial interface is operatively coupled to the serial programming interface of the programmable logic device. The control circuitry is capable of converting parallel data into a serial data stream that conforms to a pre-determined algorithm for programming the programmable logic device.

Accordingly, it is an object of the present invention to provide a method and system for programming PLDs in an embedded microprocessor system that efficiently uses microprocessor resources.

It is another object of the present invention to provide a method and system for programming PLDs without a significant increase in supporting hardware.

Some of the objects of the invention having been stated hereinabove, and which are addressed in whole or in part by the present invention, other objects will become evident as the description proceeds when taken in connection with the accompanying drawings as best described hereinbelow.

DETAILED DESCRIPTION OF THE INVENTION

Figure 1:
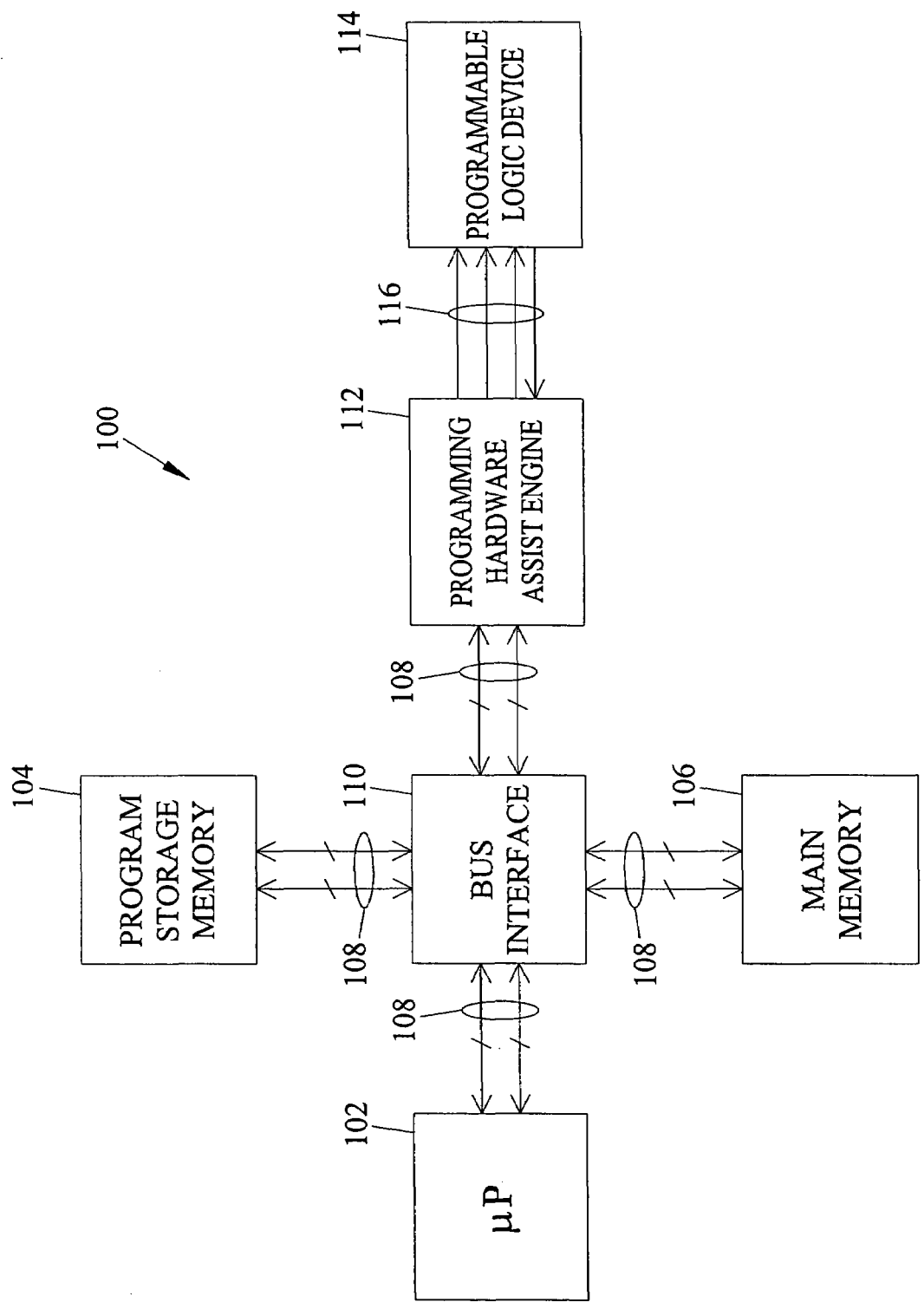
FIG. 1 is a simplified block diagram of an embedded microprocessor system in accordance with one aspect of the invention.

FIG. 1 is a simplified block diagram of an embedded microprocessor system 100 in accordance with one aspect of the invention. The embedded microprocessor system 100 includes a microprocessor 102, program storage memory 104, and main execution memory 106. Microprocessors suitable for use in embodiments of the invention are generally available from a number of sources, such as Intel and Motorola, and may include both special purpose and general purpose features. The embodiments of the invention described herein do not require any particular microprocessor features and can, therefore, be applied to a variety of microprocessor system architectures.

Program storage memory 104 may be any of a variety of non-volatile storage media, such as a ROM, EPROM, EEPROM, and FLASH memory, as well as magnetic media. The program storage memory 104 may include code instructions executed by the microprocessor 102 during system initialization. Main execution memory 106 may be any of a variety of volatile storage media, such as a suitable RAM device. The program storage memory 104 and the main execution memory 106 may include a conventional address/data bus interface 108, which are conventionally used by the microprocessor 102 to access peripheral devices, including memory. The address/data bus interface 108 provides access to an address bus, data bus, and control signals, such as chip select, read, and write. The address/data bus interface 108 of the program storage memory 104 and the main execution memory 106 may be connected directly to the address/data bus interface 108 of the microprocessor 102, or may be connected through the bus interface circuitry 110, depending, for example, on the microprocessor 102 architecture.

In accordance with one aspect of the invention, the embedded microprocessor system 100 includes a programming hardware assist (PHA) engine 112 for programming a programmable logic device (PLD) 114. The PHA engine 112 interfaces with the microprocessor 102 through the address/data bus interface 108, either directly or through the bus interface circuitry 110. The microprocessor 102 may write PLD programming data and instructions to the PHA engine 112 and the PHA engine 112 passes the data and instructions to the PLD 114 using a serial interface 116.

Figure 2:
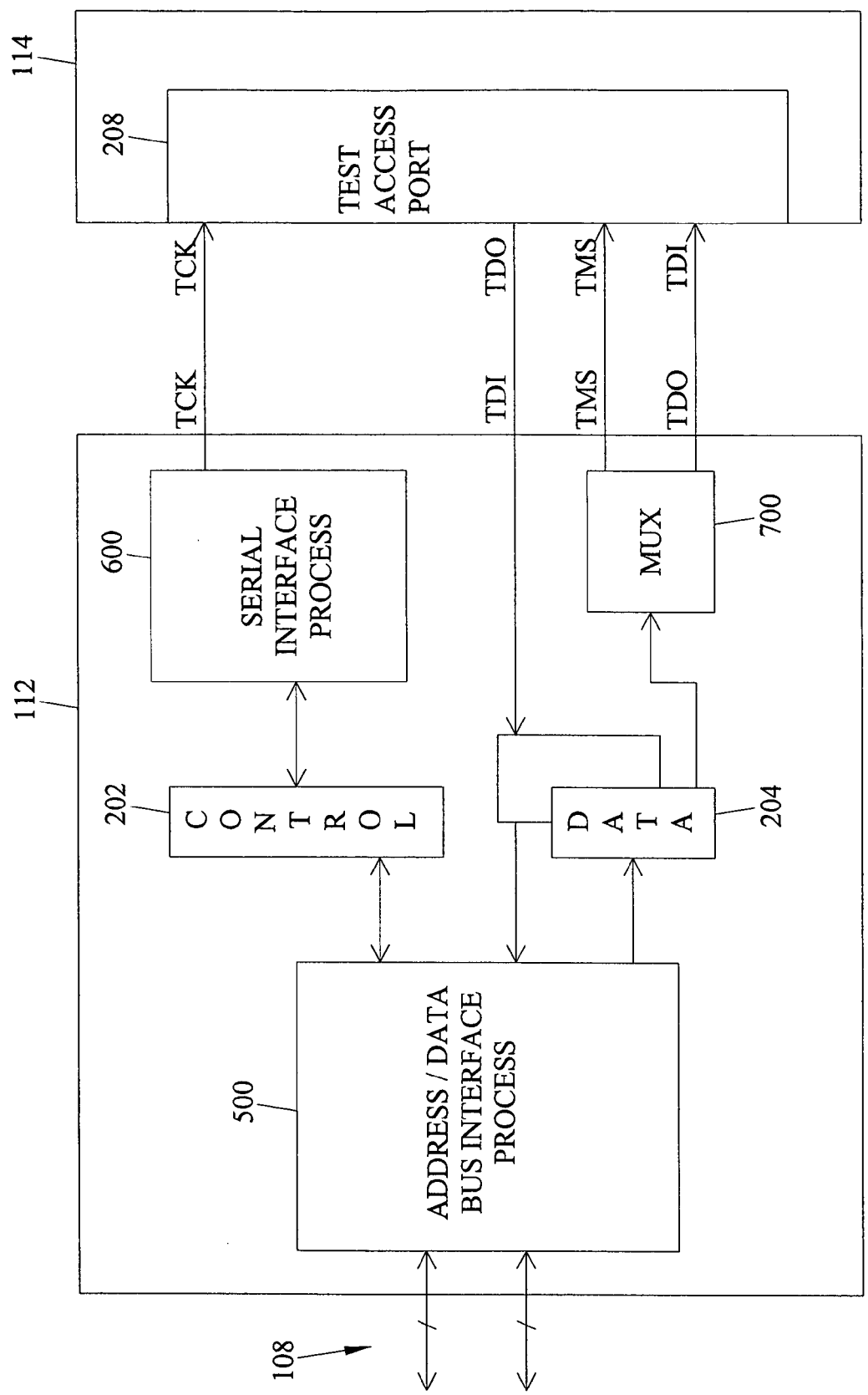
FIG. 2 is a block diagram of the PHA engine and PLD portions of the embedded microprocessor system.

FIG. 2 is a block diagram of the PHA engine 112 and PLD 114 portions of the embedded microprocessor system 100. PHA engine 112 includes a control register 202, a pair of data registers 204, an address/data bus interface process 500, a serial interface process 600, and a multiplex process 700. The address/data bus interface process 500 decodes the address bits from the microprocessor 102 to determine which register is being accessed and also examines the control signals from the microprocessor to determine if a write or read function is being performed. In the present embodiment, the PHA engine 112 includes two data registers 204. One data register receives data from the microprocessor and the other receives data from the PLD. As both data registers 204 share the same address, the address/data bus interface process 500 determines which of the two data registers to access based on whether a read or write function is being performed by the microprocessor 102. The address/data bus interface process 500 is described in greater detail below with respect to FIG. 5.

The microprocessor 102 communicates with the PHA engine 112 by reading from and writing to the control 202 and data registers 204. Based on the information in the control register 202, the serial interface process 600 converts the information in the data register 204 into a serial bit stream and, via the multiplex process 700, transfers the serial bit stream to the PLD 114 using a designated signal or combination of signals on the serial interface 116. The serial interface process 600 and the multiplex process 700 are described in detail below with respect to FIGS. 6 and 7, respectively.

In an embodiment of the invention, the serial interface 116 is defined by IEEE Standard 1149.1, "Test Access Port and Boundary Scan Architecture", commonly referred to as JTAG. Although the embodiment of the invention is described with respect to the JTAG test access port, it should be emphasized that the present invention may be adapted to other serial interfaces. Accordingly, the present invention should not be limited to using the JTAG interface. The JTAG standard defines the serial interface 116, referred to as the test access port (TAP) and an interface state machine, referred to as the TAP controller state machine. In FIG. 2, PLD 114 includes a test access port 208 that is assumed to implement a TAP controller state machine. The serial interface process 600 of PHA engine 112 may provide the interface signals necessary to communicate with the TAP 208 and control the operation of the TAP controller state machine.

The TAP includes four interface signals: test data in (TDI), test data out (TDO), test mode select (TMS), and test clock (TCK). TDI is the serial input to all JTAG instruction and data registers and TDO is the serial output from all JTAG instruction and data registers. According to the JTAG standard, the TDO signal from the controller is connected to the TDI signal of the PLD and the TDO signal from the PLD is connected to the TDI signal of the controller. TCK is the interface clock and is an output from the controller to the PLD. TMS is used to sequence through the states of a PLD TAP controller state machine and is an output from the controller to the PLD. In FIG. 2, the TCK output of PHA engine 112 is connected to the clock input of PLD 114. The TMS output of PHA engine is connected to the TMS input of PLD 114. The TDO output of PHI engine 112 is connected to the TDI input of PLD 114. The TDI input of PHA is connected to the TDO output of PLD 114.

Figure 3:
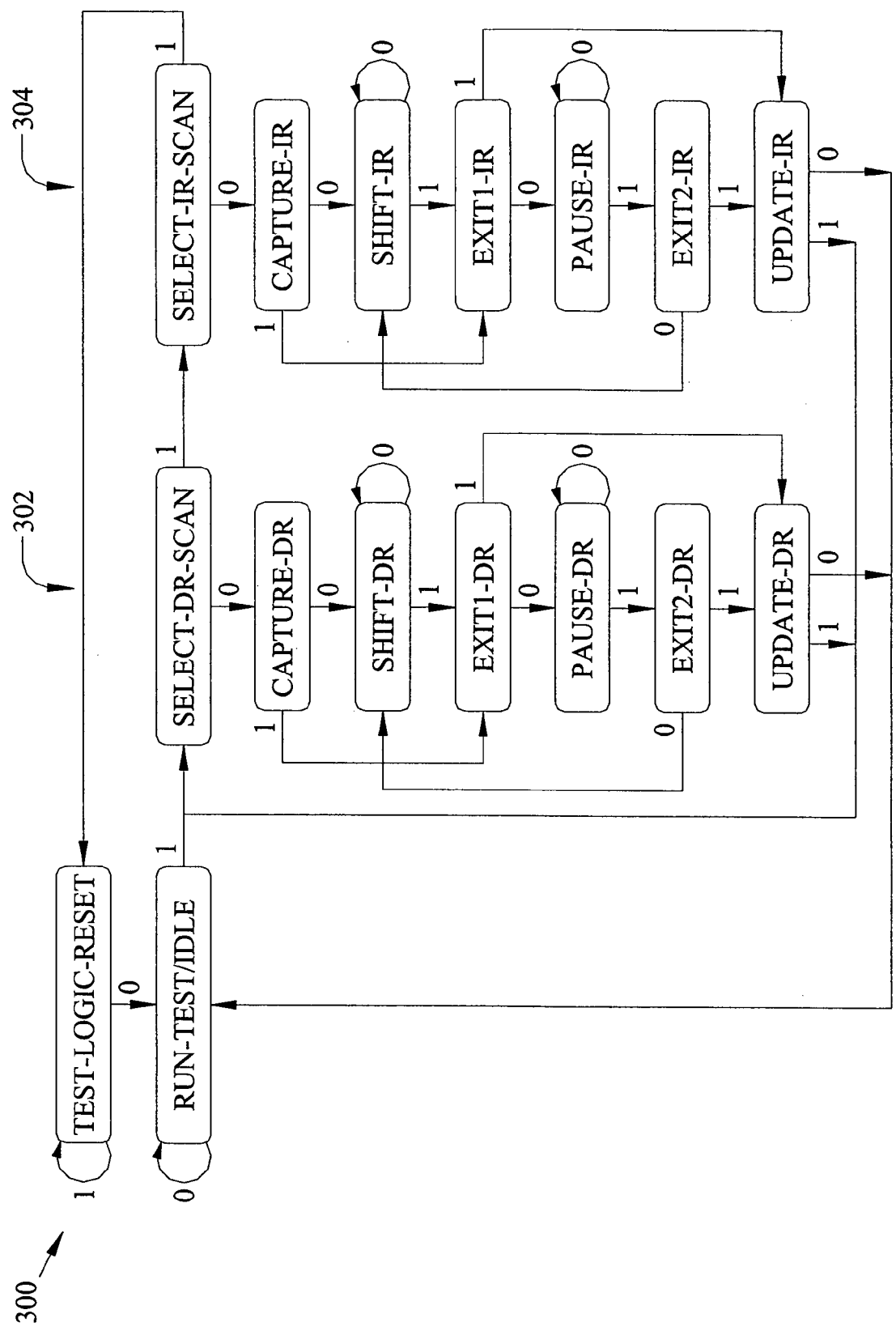
FIG. 3 is a block diagram of the JTAG TAP controller state machine.

FIG. 3 illustrates an exemplary TAP controller state machine that may be implemented by PLD 114. In FIG. 3, each block represents a state defined by the JTAG standard and each arrow represents a state transition. The bit values on each arrow represent the value of TMS required at the rising edge of TCK to move from one state to the next. For example, to advance from TEST-LOGIC-RESET to RUN-TEST/IDLE, TMS should be cleared (i.e., have a value of "0") when TCK transitions from low to high (i.e., "0" to "1"). To remain in the TEST-LOGIC-RESET state, TMS should be set (i.e., have a value of "1").

In FIG. 3, the TAP controller state machine 300 is divided into two sections: a data register section, generally indicated by reference numeral 302, and an instruction register section, generally indicated by reference numeral 304. To execute a JTAG command, the state machine 300 is advanced to the SHIFT-IR state and an opcode representing the desired command is written to the instruction register. While the state machine 300 is defined by the JTAG standard, the set of supported commands and associated opcodes varies from device to device. For example, many semiconductor devices use the JTAG interface as a mechanism to test basic functions of the semiconductor. As such, these semiconductors may not support JTAG commands intended to configure or program the device. In addition, different devices may use different opcodes to represent the same command. For example, the Virtex series of Xilinx FPGAs uses five-bit opcodes while the Virtex II series of FPGAs uses six-bit opcodes. It should be appreciated, however, that the list of supported commands and their opcodes are well documented by the device manufacturer.

Figure 4:
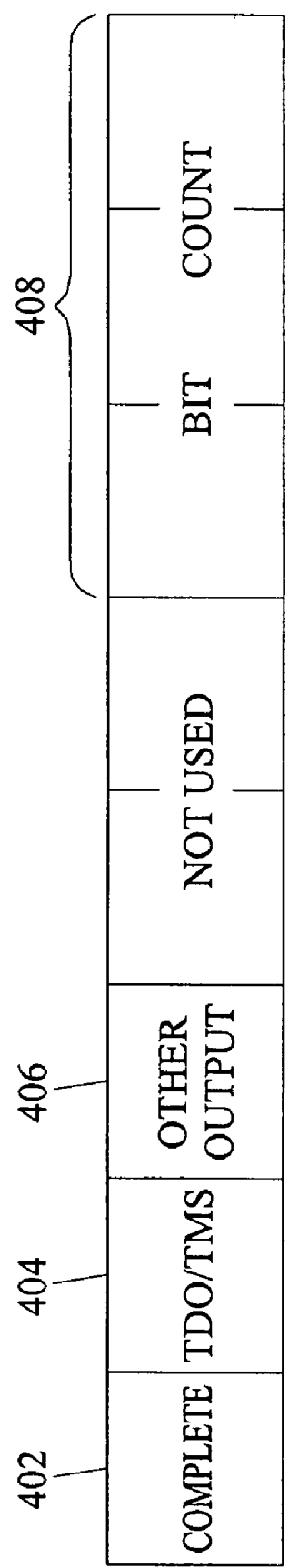
FIG. 4 is a diagram of an exemplary structure of the control register in accordance with one embodiment of the invention.

In order to control the signals output to PLD 114, a microprocessor reads status information from and writes commands to control register 202. FIG. 4 is a diagram of an exemplary structure of the control register 202 in accordance with one embodiment of the invention. While FIG. 4 includes bit definitions for eight bits, the size of the register may be adapted to include a greater or lesser number of bits based on various factors, including the number of control signals required by the serial interface being implemented and the size of the data bus.

The control register 202 depicted in FIG. 4 includes four segments of information. The first segment is a complete bit 402, which, if set by PHA engine 112, indicates that the last transaction has been completed or, if cleared, indicates that the last transaction is still being processed. The complete bit 402 may be used by the microprocessor 102 to determine, for example, whether the PHA engine 112 is ready for more data. Since the bit reflects the state of the PHA engine 112 (i.e., processing or complete), the bit is designated as a read-only bit, so that the microprocessor 102 can read the bit, but cannot directly change the value.

The second segment is a TDO/TMS bit 404, which indicates whether the data contained in the data register 204 should be output on the TDO signal or the TMS signal. In this embodiment, if the TDO/TMS bit 404 is set, then the contents of the data register 204 should be output on the TDO signal. If the TDO/TMS bit 404 is cleared, then the contents of the data register 204 should be output on the TMS signal. Thus, if the TDO/TMS bit 404 is cleared, the data in the data register 204 is output on the TMS signal and may change the state of the TAP controller state machine 300.

The third segment, referred to as the Other Output bit 406, indicates the state of the output signal not designated by the TDO/TMS bit 404. That is, if the TDO/TMS bit 404 is set, data in the data register 204 is transferred using the TDO signal and the TMS signal is held at the value of the Other Output bit 406. Similarly, if the TDO/TMS bit 404 is cleared, data in the data register 204 is transferred using the TMS signal and the TDO signal is held at the value of the Other Output bit 406. One should appreciate that the signal set to the value of the Other Output bit 406 does not change while data is being transferred using the signal designated by the TDO/TMS bit 404. Thus, when data is being output on the TDO signal, the TMS signal is held at a value that prevents a state transition (usually "0"), except as discussed below.

The forth segment is a bit-count field 408, which may be used to indicate the number of bits in the data register 204 that should be transferred to the PLD. In this embodiment, the bit-count field 408 is three-bits long and may be used to represent values from one to eight. Once the number of bits indicated by the bit-count field 408 are transferred, the PHA engine 112 sets the complete bit 402 and awaits the next instruction from the microprocessor.

Figure 5:
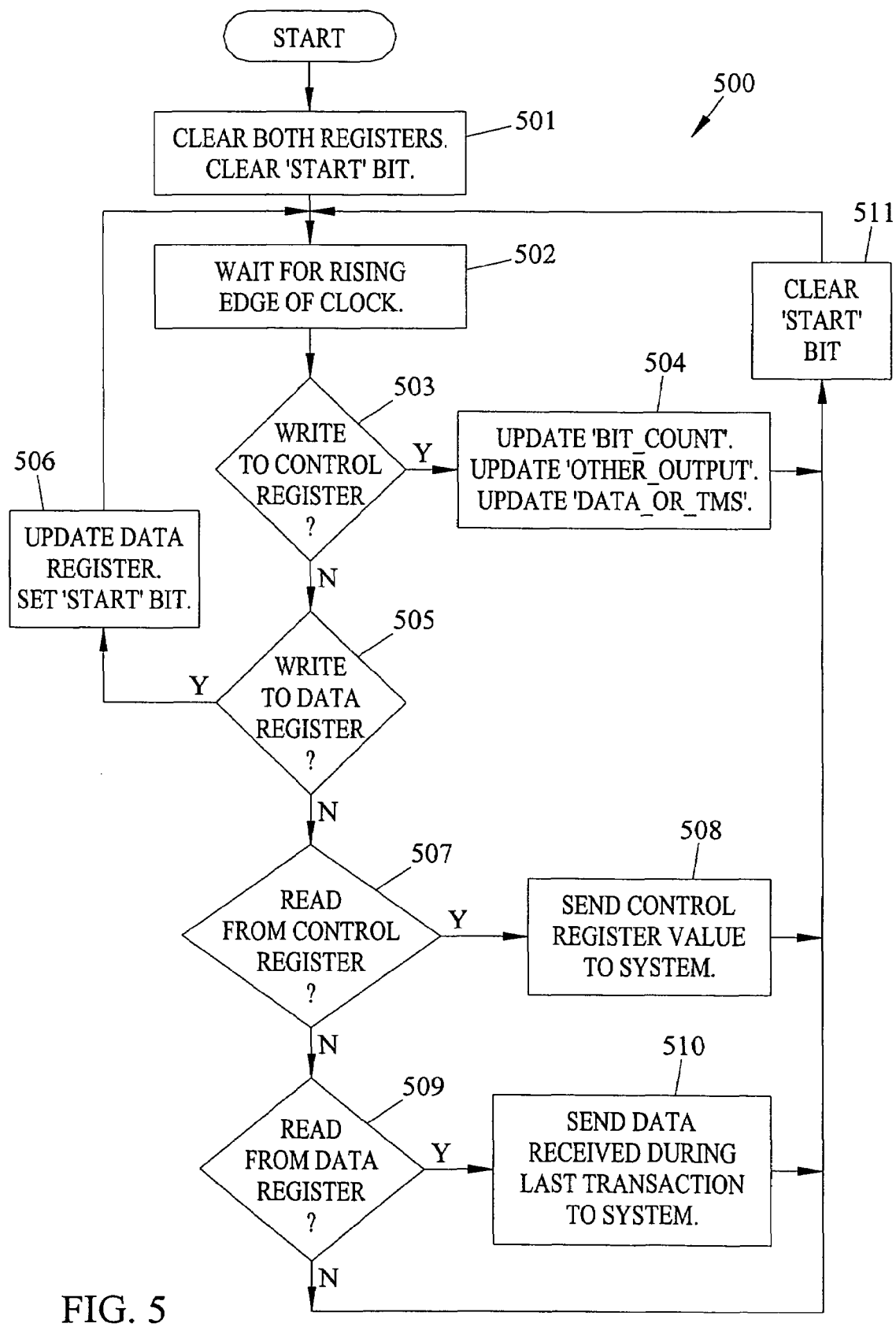
FIG. 5 depicts a flow diagram of the address/data bus interface process of the PHA engine.
Figure 6A:
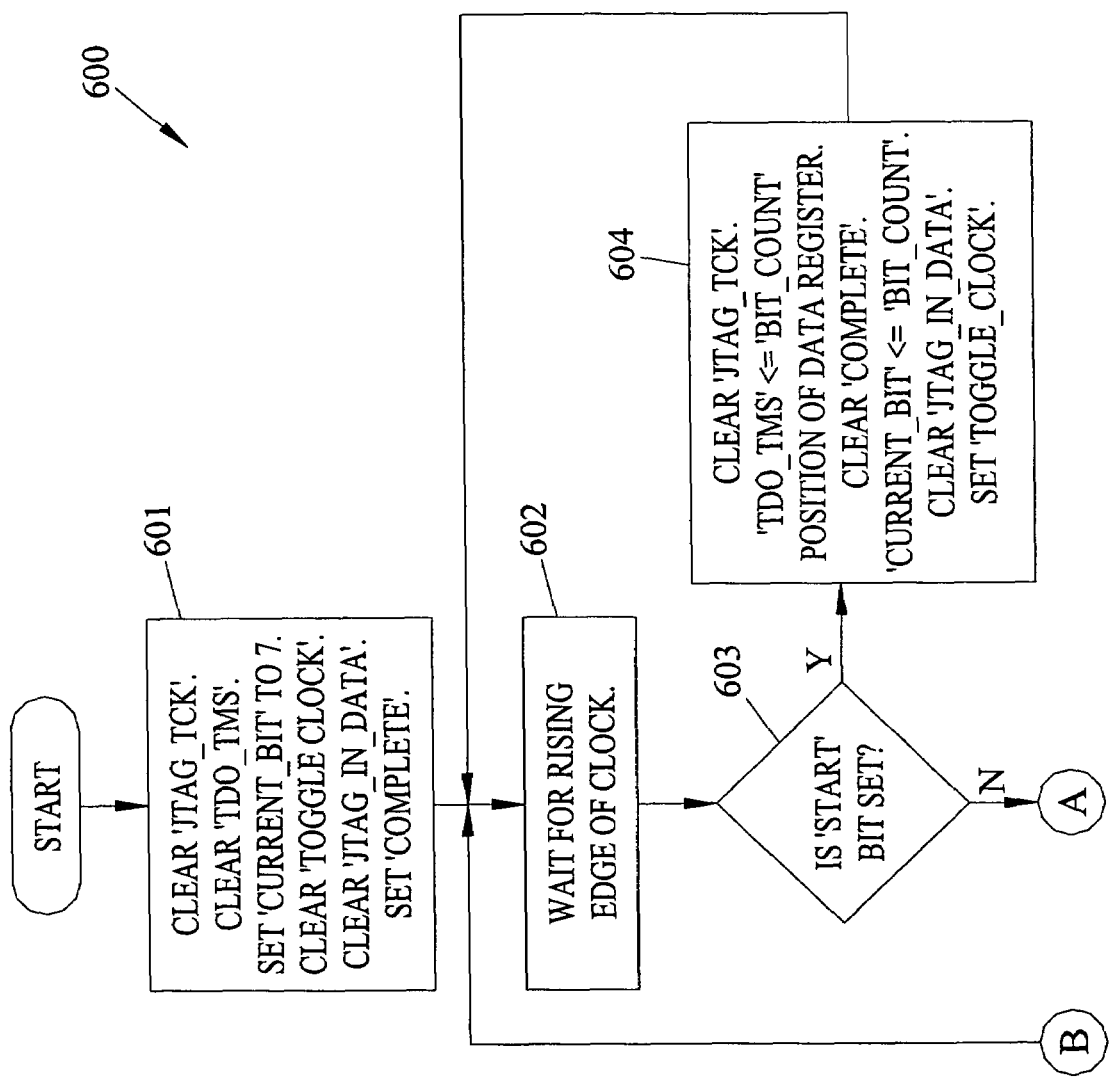
FIGS. 6A and 6B depict a flow diagram of the serial interface process of the PHA engine.
Figure 6B:
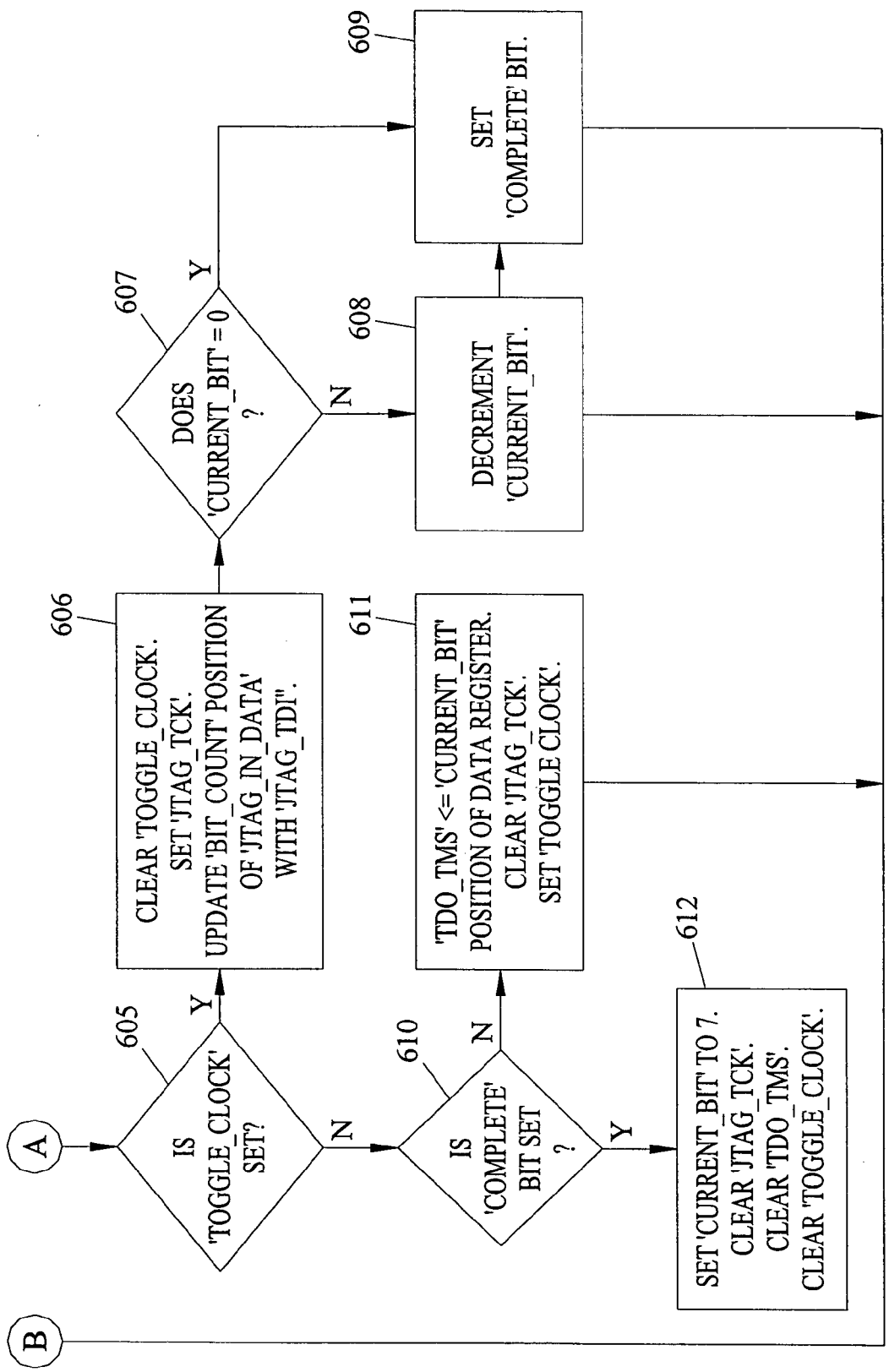
Figure 7:
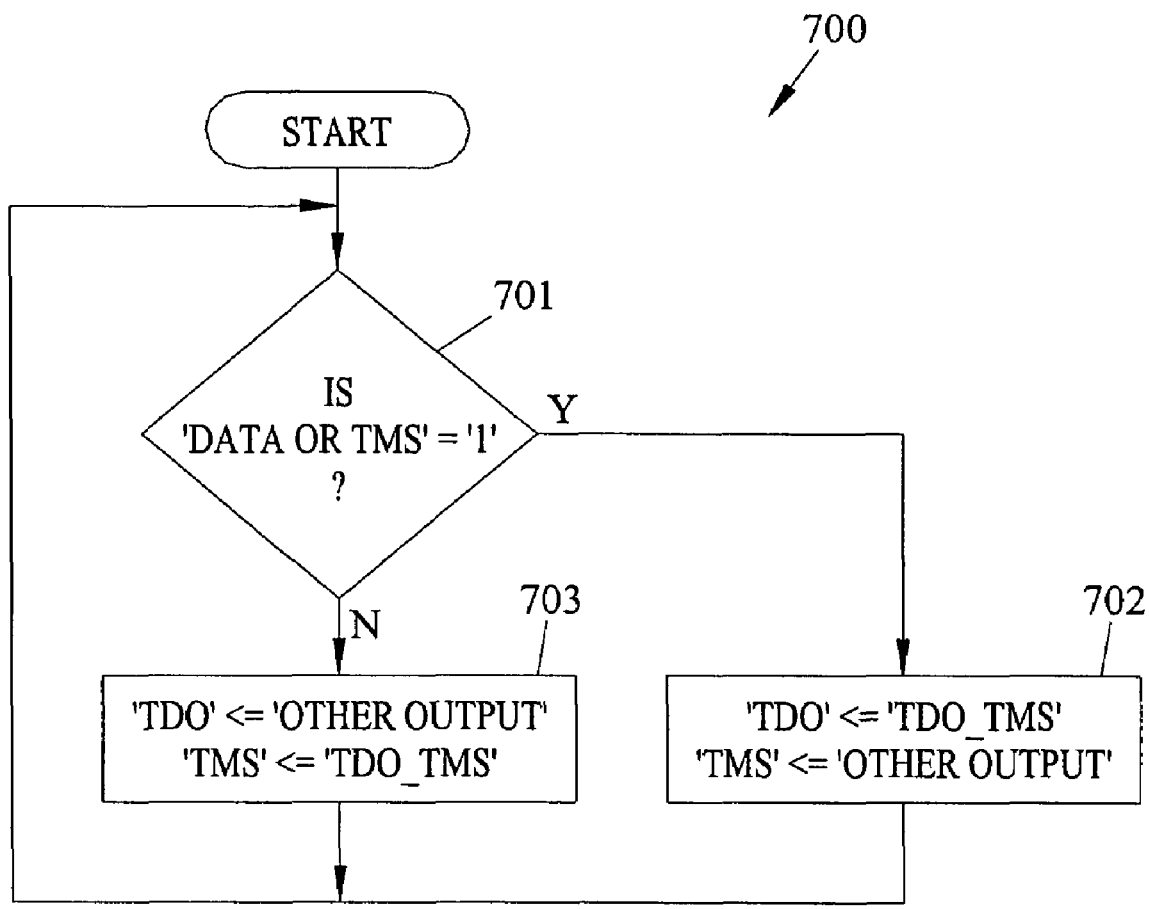
FIG. 7 depicts a flow diagram of the multiplex process of the PHA engine.

FIGS. 5–7 are flow diagrams of processes performed by the PHA engine 112 in accordance with one embodiment of the invention. The processes may be implemented using a hardware description language, such as Verilog or VHDL, to program a logic device. The processes may run continuously or may run only after being triggered by some event signal, such as an input signal state change. In the present embodiment, each process executes in a synchronous process loop and is controlled by a clock derived from the microprocessor clock.

FIG. 5 depicts a flow diagram of the address/data bus interface process 500 of the PHA engine 112. The process provides the interface between the microprocessor 102 and the PHA engine 112. As noted above, the address/data bus 108 may include control signals that enable the microprocessor 102 to write to or read from the data 202 and control 204 registers of the PHA engine 112. In one embodiment, the control register 202 has an address of 0x0E and the data register 204 has an address of 0x0F.

In step 501, the address/data bus interface process initializes itself by setting the contents of the control 202 and data 204 registers of the PHA engine 112 to a default value. In this embodiment, the control register 202 is set to 0x80, which sets the complete bit 402 to signal to the microprocessor 102 that the PHA engine 112 is ready to accept a command or data. The process also clears the "Start Bit" signal, which is an inter-process signal. Several inter-process signals may be used to communicate status information between the processes of the PHA engine 112. For example, the state of the "Start Bit" signal is used as an input to the serial interface process, which is described in detail below.

In the present embodiment, the address/data bus interfaces process is implemented as a synchronous process. As such, the execution of the process is initiated by a transition of the clock signal. In step 502, the process waits for the rising edge of the clock signal to begin process execution.

Step 503 checks to see whether a write operation to the control register 202 has occurred. As is known in the art, the determination of whether a read or write was made to a particular register can be made by evaluating the state of the microprocessor bus control signals, such as read, write, and chip select, and decoding the address bits. If a write operation was made to the control register 202, inter-process signals "Bit Count", "Other Output", and "Data or TMS" are updated (step 504). These signals correspond, respectively, to the bit-count field 408, the Other Output bit 406, and the TDO/TMS bit 404 of the control register 202. As noted above, the Complete bit of the control register is a read-only bit. As such, steps may be taken to ensure that the state of the Complete bit is not changed by the write operation, such as applying a bit mask or isolating the Complete bit from the data bus during a write operation. Once the signals are updated, execution continues by clearing the Start Bit signal (step 511).

If, in step 503, it is determined that the control register 202 was not written to, the process continues by checking, in step 505, whether a write to the data register 204 occurred. If a write operation was made to the data register 204, the contents of the data register 204 are updated and inter-process Start Bit signal is set (step 506). Setting the Start Bit signal initiates the transfer of bits from the data register to the PLD, as described in detail below with reference to Serial Interface Process 600. After the update, execution continues by waiting for the next rising edge of the clock (step 502).

If, in step 505, it is determined that the data register 204 was not written to, the process continues by checking, in step 507, whether a read from the control register 202 occurred. If a read operation was made to the control register 202, the contents of the control register 202 are made available on the data bus portion of the address/data interface 108 (step 508), and execution continues by clearing the Start Bit signal (step 511).

If, in step 507, it is determined that a read from the control register 202 did not occur, the process continues by checking, in step 509, whether a read from the data register 204 occurred. If a read operation was made to the data register 204, the contents of the data register 204 are made available on the data bus portion of the address/data interface 108 (step 510), and execution continues by clearing the Start Bit signal (step 511).

In the present JTAG embodiment, data may be received from the PLD via the TDI signal of the TAP interface. The incoming data is stored in a register for retrieval by the microprocessor. To prevent out-going data from being over-written by incoming data, separate data registers may be implemented in the PHA engine. Thus, data written to the PHA engine by the microprocessor may be stored in one data register and data received from the PLD are stored in another data register. In step 510, the data made available on the data bus is from the received PLD data register. It should be appreciated that other architectures may be employed that permit the sharing of a single data register for both incoming and outgoing data or independently addressing each data register. Such alternate architectures are considered to be within the scope of the present invention.

FIGS. 6A and 6B depict a flow diagram of the serial interface process 600 of the PHA engine. The process provides the interface between the PHA engine and the PLD that is being programmed. In this embodiment, the PHA engine interfaces to the PLD using a JTAG interface. It should be appreciated, however, that other interfaces may be implemented by making the appropriate changes to the serial interface process.

The serial interface process 600 transfers data from the data register 204 to the PLD using a synchronous serial bit stream. Data from the data register 204 is directed to either the TDO or TMS signal, as indicated by the value of the TDO/TMS bit 404 of the control register 202. Data may also be received from the PLD and stored in a JTAG data-in register. A clock signal is generated on TCK by alternately setting and clearing the signal.

In step 601, the process is initialized by clearing the TCK signal of the TAP interface and setting initial values for several internal signals. For example, the process clears the TDO/TMS signal, Toggle Clock signal, and the JTAG Data-in register. The value of the Current bit signal is set to seven and the Complete signal is set.

As with the address/data bus interfaces process, the serial interface process may be implemented as a synchronous process. As such, the execution of the process steps may be initiated by a transition of a clock signal. In step 602, the process waits for the rising edge of the clock signal to begin process execution.

Step 603 checks to see whether the Start Bit signal has been set. As discussed above, the Start Bit signal is set after a write to the data register occurs. If the Start Bit signal has been set, the value of the most significant bit of valid data in the data register 204 is assigned to the appropriate JTAG signal for transfer to the PLD and the Toggle Clock inter-process signal is set (step 604). The number of valid bits of data is specified by the Bit Count signal. In preparation for transferring data, the TCK interface signal is cleared. The process continues with step 602.

In step 605, the process checks to see whether the Toggle Clock signal is set. If it is, the process generates the rising edge of the TCK interface signal and clears the Toggle Clock inter-process signal (step 606). The process may also read the current value of the TDI interface signal and store it in the JTAG data-in register for later retrieval by the microprocessor 102. In step 607, the process checks to see if there are any more data bits to be transferred, for example, by checking the value of the Current Bit signal. If there are more bits to be transferred, the Current Bit signal is decremented (step 608). Otherwise, the process sets the Complete Bit signal (step 609). In either case, the process continues with step 602.

In step 610, the process checks whether the Complete Bit signal is set. If it is not, the value of the data bit in the data register at the location specified by the Current Bit signal is assigned to the appropriate JTAG signal for transfer to the PLD and the Toggle Clock signal is set (step 611). The TCK interface signal is also cleared, which generates the falling edge of TCK. If the Complete Bit signal is set, the TDO/TMS signal, the Toggle Clock signal, and the TCK interface signal are cleared and the Current Bit signal is set to seven (step 612).

FIG. 7 depicts a flow diagram of the multiplex process 700 of the PHA engine. As note above, data from the data register 204 is directed to either the TDO or TMS signal, as indicated by the TDO/TMS bit 404 of the control register 202. In step 701, the multiplex process checks the value of the Data or TMS inter-process signal. If the signal is set, the TDO interface signal is assigned to receive data from the data register 204 and the TMS interface signal is assigned to the value of the other output bit 406 of the control register 202 (step 702). If the Data or TMS inter-process signal is cleared, the TMS interface signal is assigned to receive data from the data register 204 and the TDO interface signal is assigned to the value of the other output bit 406 of the control register 202 (step 703).

During system initialization, the microprocessor 102 reads the PLD programming data from the program storage memory 104 to the main execution memory 106. The PLD programming data may include not only the bit stream used to configure the PLD, but also the specific JTAG instructions (i.e., state machine transitions and command opcodes) needed to configure the target PLD, verify successful completion of the programming operations, or determine specific information about the PLD (e.g. PLD version and model number). The data received from the PLD is clocked in and stored in the incoming data register 204 of PHA engine 112, and the Complete bit in the control register is set. The microprocessor may read the data register to retrieve the stored information.

Figure 8:
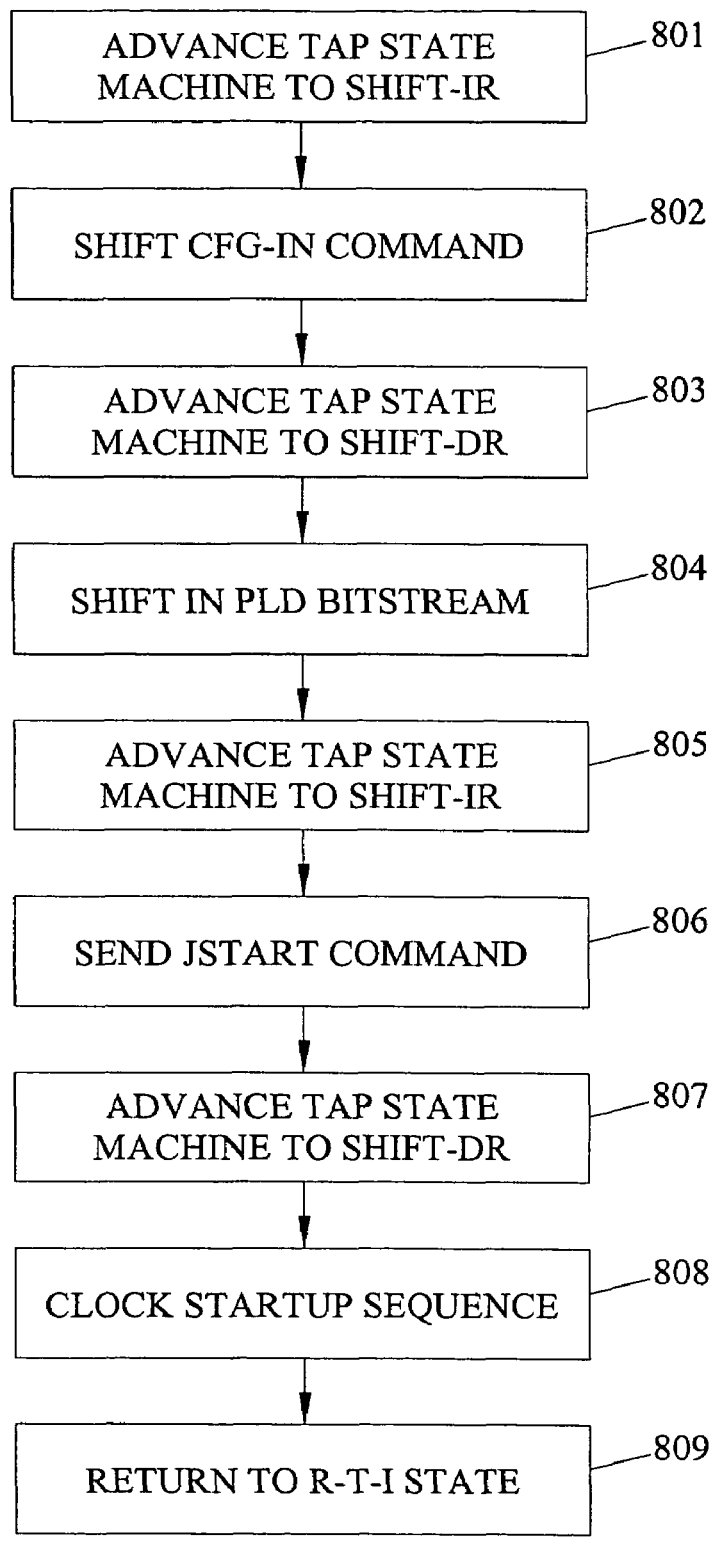
FIG. 8 is a flow diagram of exemplary steps for programming a PLD.

FIG. 8 is a flow diagram of exemplary steps for programming a PLD. The steps illustrate the procedure for programming a XILIN® VIRTEX™ II field programmable gate array, although the procedure may be modified to program other PLDs. In step 801, the TAP state machine 300 is advanced to the SHIFT-IR state. The SHIFT-IR state is used to shift commands into the instruction register of the PLD's TAP interface. Table 1 depicts exemplary reads and writes to the control and data registers of the PHA engine that may be used to accomplish step 801.

TABLE 1

| Line | R/W | Register | Data |
| --- | --- | --- | --- |
| 1 | Write | Control | 0000 0111 |
| 2 | Write | Data | 1101 1111 |
| 3 | Read | Control | 1xxx xxxx |
| 4 | Write | Control | 0000 0001 |
| 5 | Write | Data | 0000 0000 |
| 6 | Read | Control | 1xxx xxxx |

As shown in line 1 of Table 1, the control register is configured to indicate that eight bits from the data register should be output on TMS while holding TDO at "0". In line 2, the data register is written with data as indicated in the table. As mentioned previously, the data is transferred least-significant bit first. Since programming the PLD using the JTAG interface requires transitioning from state to state, the TAP state machine is initialized using a stream of five 1's to ensure that the state machine is in the TEST-LOGIC-RESET state. The next three bits advance the state machine to the SELECT-IR-SCAN state. The microprocessor may read the control register and examine the most significant bit to determine when the serial data transfer is complete (line 3). The values of the remaining bits may be either "0" or "1", and are shown in Tables 1–6 by an "x" to indicate that the value of these bits are not being evaluated. In lines 4–6, the control register is configured to transfer two bits from the data register and the microprocessor waits for the complete bit to be set.

In step 802, the opcode for the CFG_IN command is shifted into the instruction register, preparing the PLD to receive configuration data into the PLD data register. Table 2 depicts exemplary reads and writes to the control and data registers of the PHA engine that may be used to accomplish step 802.

TABLE 2

| Line | R/W | Register | Data |
| --- | --- | --- | --- |
| 7 | Write | Control | 0100 0100 |
| 8 | Write | Data | 0000 0101 |
| 9 | Read | Control | 1xxx xxxx |
| 10 | Write | Control | 0110 0000 |
| 11 | Write | Data | 0000 0000 |
| 12 | Read | Control | 1xxx xxxx |

In line 7 of Table 2, the control register is configured to indicate that five bits from the data register should be output on TDO while holding TMS at "0," which keeps the TAP state machine in the SHIFT-IR state. The five bits of the CFG_IN opcode are loaded into the data register (line 8). The microprocessor may, in line 9, check the control register to determine if the complete bit is set. In lines 10 and 11, the control register is configured to transfer one bit of data on the TDO signal while holding TMS at "1". According to the TAP state machine protocol, the last bit of the opcode is transferred as the state machine is advanced to the next state.

In step 803, the TAP state machine 300 is advanced to SHIFT-DR state, using a sequence of reads and writes to the control and data registers, as shown in Table 3.

TABLE 3

| Line | R/W | Register | Data |
| --- | --- | --- | --- |
| 13 | Write | Control | 0000 0011 |
| 14 | Write | Data | 0000 0011 |
| 15 | Read | Control | 1xxx xxxx |

In state 804, the PLD configuration bit stream is transferred to the PLD. This may be accomplished in three stages using a sequence of reads and writes, as shown in Table 4.

TABLE 4

| Line | R/W | Register | Data |
| --- | --- | --- | --- |
| 16 | Write | Control | 0100 0111 |
| 17 | Write | Data | xxxx xxxx |
| 18 | Read | Control | 1xxx xxxx |
| 19 | Write | Data | xxxx xxxx |
| 20 | Read | Control | 1xxx xxxx |
| 21 | Write | Control | 0100 0nnn |
| 22 | Write | Data | xxxx xxxx |

TABLE 4-continued

| Line | R/W | Register | Data |
| --- | --- | --- | --- |
| 23 | Read | Control | 1xxx xxxx |
| 24 | Write | Control | 0110 0000 |
| 25 | Write | Data | xxxx xxxn |
| 26 | Read | Control | 1xxx xxxx |

In line 16 of Table 4, the control register is configured to indicate that eight bits from the data register should be output on TDO while holding TMS at "0," which keeps the TAP state machine in the SHIFT-DR state. The first eight bits of PLD programming bitstream are written to the data register (line 17) and the microprocessor waits for the complete bit to be set. The next eight bits are written to the data register in line 19. Since the eight bits in the data register are going to be output on TDO and TMS is going to be held at "0", it is not necessary to write to the control register again as the control register is already configured in this manner. In line 20, the microprocessor again waits for the complete bit to be set. Lines 19 and 20 repeat until there are eight or fewer bits remaining in the bitstream. In line 21, the control register is configured to output one less than the number of remaining bits and this number of bits is written to the data register (line 22). For example, if seven bits remain in the bitstream, the control register is configured to output six bits and six bits are written to the data register. Once the microprocessor reads that the complete bit is set (line 23), the control register is configured to advance the TAP state machine to the next state and output the remaining bit of the PLD programming bitstream (line 24).

Once the transfer of the PLD programming bit stream is complete, the state machine is again advanced to the SHIFT_IR state (step 805) and the opcode for the JSTART command is transferred to the PLD instruction register (step 806). The start command initializes the startup sequence for the VIRTEX field progammable gate array. Exemplary reads and writes to the control and data registers are shown in Table 5.

TABLE 5

| Line | R/W | Register | Data |
| --- | --- | --- | --- |
| 27 | Write | Control | 0000 0100 |
| 28 | Write | Data | 0000 0111 |
| 29 | Read | Control | 1000 0000 |
| 30 | Write | Control | 0100 0100 |
| 31 | Write | Data | 0000 1100 |
| 32 | Read | Control | 1xxx xxxx |
| 33 | Write | Control | 0110 0000 |
| 34 | Write | Data | 0000 0000 |
| 35 | Read | Control | 1xxx xxxx |

Moving again to the SHIFT-DR state (step 807), the startup sequence is clocked into the PLD data register (step 808). The startup sequence includes remaining in the SHIFT-DR state for a minimum of 12 clock cycles. Exemplary reads and writes to the control and data registers are shown in Table 6.

TABLE 6

| Line | R/W | Register | Data |
| --- | --- | --- | --- |
| 36 | Write | Control | 0000 0111 |
| 37 | Write | Data | 0000 0011 |
| 38 | Read | Control | 1xxx xxxx |

TABLE 6-continued

| Line | R/W | Register | Data |
|------|-------|---------|-----------|
| 39 | Write | Data | 0000 0000 |
| 40 | Read | Control | 1xxx xxxx |
| 41 | Write | Control | 0000 0010 |
| 42 | Write | Data | 0000 0011 |
| 43 | Read | Control | 1xxx xxxx |

Once the startup sequence is complete, the state machine 300 is advanced to the RUN-TEST/IDLE state (step 809) and the PLD begins functioning as programmed by the configuration bit stream. Exemplary reads and writes are shown above on lines 42 and 43 of Table 6.

The above-described hardware assisted method of programming a PLD was evaluated against the conventional bit-banging method of programming a PLD. The results are shown in Table 7.

TABLE 7

|  | Bit-Banging (actual) | Hardware Assisted (actual) | Bit-Banging (theoretical) |
|---|---|---|---|
| File Size (bytes) | 27,847 | 646,350 | 646,350 |
| Programming Time (seconds) | 7.4 | 2.0175 | 171.76 |
| Programming Rate (KBytes/s) | 3.763108108 | 320.3717472 | 3.763108108 |

The first data column, labeled "Bit-Banging (actual)", shows the results obtained from programming a CPLD with 27,847 bytes of data using the bit-banging method. Programming the CPLD took approximately 7.4 seconds using this method, for a programming rate of approximately 3.76 kilobytes per second. It should be noted that the programming time shown in Table 7 reflects the amount of time that the microprocessor is actively engaged in programming the PLD.

By comparison, the second data column, labeled "Hardware Assisted (actual)", shows the results obtained from programming an FPGA with 646,350 bytes of data using the hardware assisted method described above. Programming the FPGA took approximately 2.02 seconds, for a programming rate of approximately 320.4 kilobytes per second.

The third data column, labeled "Bit-Banging (theoretical)", provides an estimate of how long it would take to program an FPGA using the bit-banging method. The estimate assumes that the FPGA would be programmed with 646,350 bytes of data at the same programming rate obtained by programming the CPLD, that is, approximately 3.76 kilobytes per second. Based on these assumptions, it is estimated that programming the FPGA using the bit-banging method would require approximately 171.76 seconds. Thus, the PHA engine permits the FPGA to be programmed approximately 98.8% faster than programming using the conventional bit-banging method.

Accordingly, using a programming hardware assist engine provides a significant improvement in the time required to program a programmable logic device. Moreover, the task of providing a serial programming data stream and clock to the programmable logic device is off-loaded to the programming hardware assist engine, thereby freeing the microprocessor to perform other tasks. For example, while the PHA engine is transferring the most recently received data, the microprocessor is free to handle other tasks. In addition, the microprocessor may allow large amounts of time to elapse between each interaction with the PHA engine such that if a minimum amount of time has elapsed, the microprocessor may assume that the Complete bit is set and forego reading the control register. The microprocessor may also allow large amounts of time to elapse to allow time critical software operations to fully execute.

It will be understood that various details of the invention may be changed without departing from the scope of the invention. Furthermore, the foregoing description is for the purpose of illustration only, and not for the purpose of limitation, as the invention is defined by the claims as set forth hereinafter.

What is claimed is:

1. A programming hardware assist engine comprising:
    (a) a data register for receiving, from a microprocessor, programming data and control information to be written to a programmable logic device (PLD);
    (b) a control register for storing bits written by the microprocessor to control the writing of the programming data and the control information to the PLD; and
    (c) a serial interface process for reading the bits in the control register and controlling the serial writing of the data from the data register to the PLD, wherein the data register, the control register, and the serial interface process are separate from the PLD and the microprocessor and control programming of the PLD by the microprocessor.

2. The programming hardware assist engine of claim 1, wherein the serial interface process is adapted to control a data output signal and a clock output signal to the PLD.

3. The programming hardware assist engine of claim 1, wherein the serial interface process is adapted to control a mode select output signal for changing an operating mode of the PLD.

4. The programming hardware assist engine of claim 1, wherein the serial interface process is adapted to control a data output signal, a clock output signal, and a mode select output signal for changing an operating mode of the PLD.

5. The programming hardware assist engine of claim 4, wherein the PLD conforms to a test access port interface standard and the operating mode of the PLD is selected from a group defined by a test access pod state machine standard.

6. The programming hardware assist engine of claim 5, wherein the test access port interface standard and the test access port state machine standard are defined by IEEE Standard 1149.1.

7. A programming hardware assist engine comprising:
    (a) data register for receiving programming data and control information to be written to a programmable logic device (PLD);
    (b) a control register for storing bits to control the writing of the programming data and the control information to the PLD; and (c) a serial interface process for reading the bits in the control register and controlling the serial writing of the data from the data register to the PLD, wherein at least one bit in the control register indicates to which of the plurality of interface signals the data in the data register should be directed.

8. The programming hardware assist engine of claim 7, wherein at least one bit in the control register indicates a value to be output on the at least one of the plurality of interface signals not selected to receive data from the data register.

9. An embedded microprocessor system comprising:
(a) a microprocessor operatively coupled to an address bus and data bus;
(b) a non-volatile memory operatively coupled to the address bus and data bus, the non-volatile memory having addressable memory locations, a portion of the locations containing instructions executable by the microprocessor and another portion of the locations containing data;
(c) a programmable logic device having a serial programming interface; and
(d) a programming hardware assist engine separate from the microprocessor and the programmable logic device for controlling programming of the programmable logic device by the microprocessor, the hardware programming assist engine having a parallel interface, a serial interface, and control circuitry, the parallel interface being operatively coupled to the address bus and data bus, the serial interface being operatively coupled to the serial programming interface of the programmable logic device, and the control circuitry being capable of converting parallel data into a serial data stream that conforms to a predetermined algorithm for programming the programmable logic device.

10. The system of claim 9, wherein the serial interface is adapted to control a data output signal and a clock output signal to the PLD.

11. The system of claim 9, wherein the serial interface is adapted to control a mode select output signal for changing an operating mode of the PLD.

12. The system of claim 9, wherein the serial interface is adapted to control a data output signal, a clock output signal, and a mode select output signal for changing an operating mode of the PLD.

13. The system of claim 12, wherein the PLD conforms to a test access port interface standard and the operating mode of the PLD is selected from a group defined by a test access port state machine standard.

14. The system of claim 13, wherein the test access port interface standard and the test access port state machine standard are defined by IEEE Standard 1149.1.

15. A method of programming a programmable logic device (PLD) in a microprocessor system comprising:
(a) reading, by a microprocessor, programming data from a first memory using a parallel bussed interface;
(b) writing, by the microprocessor, programming data to a programming hardware assist engine using the parallel bussed interface, the programming hardware assist engine being separate from the microprocessor and the programmable logic device for controlling programming of the programmable logic device by the microprocessor;
(c) directing, in the programming hardware assist engine, a portion of the programming data to a specified serial interface signal; and
(d) outputting a serial bit stream from the programming hardware assist engine to a serial programming interface of the PLD using the specified serial interface signal.

16. The method of claim 15, wherein the programming data includes PLD configuration information and serial programming protocol information.

17. The method of claim 16, wherein the serial programming protocol information selects an operating mode of the PLD.

18. The method of claim 17, wherein the operating mode of the PLD is selected from a group defined by a test access port state machine standard.

19. The method of claim 18, wherein the test access port state machine standard is defined by IEEE Standard 1149.1.

20. A method of programming a programmable logic device (PLD) in a microprocessor system comprising:
(a) reading, by a microprocessor, programming data from a first memory using a parallel bussed interface;
(b) writing, by the microprocessor, programming data to a programming hardware assist engine using the parallel bussed interface;
(c) directing, in the programming hardware assist engine, a portion of the programming data to a specified serial interface signal; and
(d) outputting a serial bit stream from the programming hardware assist engine to a serial programming interface of the PLD using the specified serial interface signal, wherein the programming data includes PLD configuration information and serial programming protocol information and wherein the PLD configuration information and serial programming protocol information are directed to separate serial interface signals.

21. A method of programming a programmable logic device (PLD) in a microprocessor system comprising:
(a) reading, by a microprocessor, programming data from a first memory using a parallel bussed interface;
(b) writing, by the microprocessor, programming data to a programming hardware assist engine using the parallel bussed interface;
(c) directing, in the programming hardware assist engine, a portion of the programming data to a specified serial interface signal; and
(d) outputting a serial bit stream from the programming hardware assist engine to a serial programming interface of the PLD using the specified serial interface signal and reading, by the microprocessor, data received by the programming hardware assist engine from the PLD in response to a prior command.

* * * * *